(12) United States Patent
He et al.

(10) Patent No.: US 11,538,774 B2
(45) Date of Patent: Dec. 27, 2022

(54) WIRELESS TRANSMISSION MODULE AND MANUFACTURING METHOD

(71) Applicant: HUAWEI TECHNOLOGIES CO., LTD., Guangdong (CN)

(72) Inventors: Qijing He, Dongguan (CN); Xiaojing Liao, Shanghai (CN); Zhaozheng Hou, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 233 days.

(21) Appl. No.: 17/106,520

(22) Filed: Nov. 30, 2020

(65) Prior Publication Data

US 2021/0082842 A1 Mar. 18, 2021

Related U.S. Application Data

(63) Continuation of application No. PCT/CN2019/073318, filed on Jan. 28, 2019.

(30) Foreign Application Priority Data

Jun. 1, 2018 (CN) .......................... 201810559223.X

(51) Int. Cl.
*H01L 23/66* (2006.01)
*H04B 1/04* (2006.01)
(Continued)

(52) U.S. Cl.
CPC .............. *H01L 23/66* (2013.01); *H01L 21/56* (2013.01); *H01L 23/552* (2013.01); *H01L 24/24* (2013.01);
(Continued)

(58) Field of Classification Search
CPC .......... H04B 1/04; H04B 1/0475; H04B 1/10; H04B 1/38; H04B 1/40; H04B 5/00;
(Continued)

(56) References Cited

U.S. PATENT DOCUMENTS

| 8,081,079 B1 | 12/2011 | Camarota |
| 9,761,522 B2 | 9/2017 | Chu et al. |

(Continued)

FOREIGN PATENT DOCUMENTS

| CN | 1643626 A | 7/2005 |
| CN | 102308349 A | 1/2012 |

(Continued)

*Primary Examiner* — Quochien B Vuong
(74) *Attorney, Agent, or Firm* — Womble Bond Dickinson (US) LLP

(57) ABSTRACT

A wireless transmission module, chips, a passive component, and a coil are integrated into an integral structure, so that an integration level of the wireless transmission module is improved. In addition, the integral structure can effectively implement independence of the module, and the independent module can be flexibly arranged inside structural design of an electronic device, and does not need to be disposed on a mainboard of the electronic device. Only an input terminal of the wireless transmission module needs to be retained on the mainboard of the electronic device. In addition, the integral structure can further effectively increase a capability of a product for working continuously and normally in an extremely harsh scenario, and improve product reliability. In addition, in the structure of the wireless transmission module, the chips and the coil are integrated, and signal transmission paths between the chips and the coil are relatively short.

18 Claims, 10 Drawing Sheets

(51) Int. Cl.
*H04B 5/00* (2006.01)
*H01L 23/552* (2006.01)
*H01L 21/56* (2006.01)
*H01L 23/00* (2006.01)
*H01L 25/16* (2006.01)

(52) U.S. Cl.
CPC .............. *H01L 24/82* (2013.01); *H01L 25/16* (2013.01); *H04B 1/04* (2013.01); *H01L 2223/6677* (2013.01); *H01L 2224/24011* (2013.01); *H01L 2224/24101* (2013.01); *H01L 2224/24195* (2013.01); *H01L 2224/82101* (2013.01); *H01L 2224/82106* (2013.01)

(58) Field of Classification Search
CPC .. H04B 5/0025; H04B 5/0031; H04B 5/0037; H04B 5/005; H04B 5/0081; H04B 7/00; H01L 21/50; H01L 21/56; H01L 21/58; H01L 23/48; H01L 23/481; H01L 23/50; H01L 23/52; H01L 23/58; H01L 23/66; H01L 23/552; H01L 24/24; H01L 24/25; H01L 24/26; H01L 24/82; H01L 24/83; H01L 25/16
See application file for complete search history.

(56) References Cited

U.S. PATENT DOCUMENTS

| | | | | |
|---|---|---|---|---|
| 9,761,946 | B2* | 9/2017 | Moon | H04B 5/0087 |
| 10,056,922 | B1* | 8/2018 | Tsvelykh | H04B 1/04 |
| 10,970,610 | B2* | 4/2021 | Ueki | H01Q 9/285 |
| 11,005,285 | B2* | 5/2021 | Partovi | H04W 4/80 |
| 2011/0285215 | A1 | 11/2011 | Hatase | |
| 2015/0140927 | A1* | 5/2015 | Chen | H04B 5/02 455/41.1 |
| 2018/0109132 | A1* | 4/2018 | Cho | H04B 5/0037 |
| 2018/0182704 | A1* | 6/2018 | Yeh | H01L 23/528 |

FOREIGN PATENT DOCUMENTS

| | | |
|---|---|---|
| CN | 104247013 A | 12/2014 |
| CN | 104598849 A | 5/2015 |
| CN | 204990359 U | 1/2016 |
| CN | 105870024 A | 8/2016 |
| CN | 105874595 A | 8/2016 |
| CN | 106163106 A | 11/2016 |
| CN | 107170731 A | 9/2017 |
| CN | 107452691 A | 12/2017 |
| CN | 107611114 A | 1/2018 |

* cited by examiner

WIRELESS TRANSMISSION MODULE AND MANUFACTURING METHOD

CROSS-REFERENCE TO RELATED APPLICATIONS

This application is a continuation of International Patent Application No. PCT/CN2019/073318, filed on Jan. 28, 2019, which claims priority to Chinese Patent Application No. 201810559223.X, filed on Jun. 1, 2018. The disclosures of the aforementioned applications are hereby incorporated by reference in their entireties.

TECHNICAL FIELD

This application relates to the field of semiconductor manufacturing technologies, and in particular, to a wireless transmission module and a manufacturing method.

BACKGROUND

Wireless transmission modules such as a wireless charging module and a near field communication (NFC) module implement signal/energy transmission between a transmitter and a receiver by using an electromagnetic field, and are widely applied to various types of electronic devices.

Currently, a structure of assembling a wireless transmission module and an electronic device is shown in FIG. 1(a) and FIG. 1(b), where FIG. 1(a) is a top view of the assembly structure, and FIG. 1(b) is a schematic sectional view of the assembly structure. As shown in FIG. 1(a) and FIG. 1(b), chips 11 and a passive component 12 are mounted on a mainboard 13 of the electronic device, and a coil and a magnetic material 14 are disposed outside the mainboard 13 (generally disposed at a position close to a housing of structural design of the electronic device). Therefore, the coil and the chips 11 of the wireless transmission module are separated, leading to a relatively low integration level of the wireless transmission module. In the wireless transmission module with a relatively low integration level, all of the chips 11 and the passive component 12 need to be mounted on the mainboard 13. As a result, the wireless transmission module occupies a relatively large area of the mainboard 13 of the electronic device, and this does not facilitate miniaturization and thinning of the electronic device.

In addition, sensitive components such as the chips 11 and the passive component 12 of the wireless transmission module are directly mounted on the mainboard of the electronic device. As a result, the sensitive components are exposed to an external environment and are easily damaged, leading to relatively low product reliability.

In addition, the chips 11 and the coil are separated, and a line path is relatively long. As a result, relatively high parasitic impedance is generated. The relatively high parasitic impedance reduces power density of the module.

SUMMARY

The application provides a wireless transmission module and a manufacturing method therefor, to improve an integration level of a wireless transmission module.

To achieve the foregoing invention objective, the following technical solutions are used in this application.

A first aspect of this application provides a wireless transmission module, including a substrate, a magnetic shield layer structure located on the substrate, and a coil located on the magnetic shield layer structure, where chips and a passive component that are separated from each other are embedded inside the substrate; and the coil is electrically connected to the chips.

In the wireless transmission module provided in the first aspect of this application, the chips, the passive component, and the coil are integrated into an integral structure, to improve an integration level of the wireless transmission module. In addition, the integral structure can effectively implement independence of the module, the independent module may be flexibly arranged inside structural design of an electronic device, and does not need to be disposed on a mainboard of the electronic device, and only an input terminal of the wireless transmission module needs to be retained on the mainboard of the electronic device. Therefore, the wireless transmission module occupies a relatively small area of the mainboard. In addition, in the wireless transmission module in this application, the chips are embedded inside the substrate, so that disposing the chips does not increase a size of the wireless transmission module, or has very small impact on a size of the wireless transmission module. Therefore, compared with a wireless transmission module in the prior art, the wireless transmission module provided in this application helps to improve miniaturization and thinning of the electronic device. In addition, in the integral structure, sensitive components such as the chips and the passive component are embedded inside the substrate, and are not in contact with an external environment. Therefore, the wireless transmission module provided in this application can further effectively increase a capability of a product for working continuously and normally in an extremely harsh scenario, and improve product reliability. In addition, in the structure of the wireless transmission module, the chips and the coil are integrated, and signal transmission paths between the chips and the coil are relatively short. Therefore, parasitic impedance generated on the signal transmission paths is relatively low, thereby increasing power density of the module.

In an embodiment, a first line layer is disposed on an upper surface of the substrate, and a second line layer is disposed on a lower surface of the substrate; first through holes extending through the upper surface and the lower surface of the substrate are further provided on the substrate; and the first through holes are filled with a conductive material;

second through holes extending through an upper surface and a lower surface of the magnetic shield layer structure are provided on the magnetic shield layer structure; and the second through holes are filled with a conductive material;

blind holes are provided between the second line layer and the chips, and the blind holes are filled with a conductive material; and the coil is interconnected with the chips through the second through holes, the first line layer, the first through holes, the blind holes, and the second line layer.

This possible embodiment helps to shorten the signal transmission paths between the chips and the coil. Therefore, the parasitic impedance generated on the signal transmission paths is relatively low, thereby increasing power density of the module.

In an embodiment, there are a plurality of chips, and the different chips are interconnected through the blind holes and the second line layer.

This possible embodiment helps to shorten the signal transmission paths between the chips and the coil. Therefore, the parasitic impedance generated on the signal transmission paths is relatively low, thereby increasing power density of the module.

In an embodiment, the magnetic shield layer structure includes a first dielectric layer, a magnetic shield layer, and a second dielectric layer that are laminated and bonded together, where the magnetic shield layer is sandwiched between the first dielectric layer and the second dielectric layer.

This possible embodiment facilitates thinning of the wireless transmission module.

In an embodiment, the first dielectric layer and/or the second dielectric layer include a plurality of dielectric sub-layers.

In an embodiment, a base material of the substrate is copper.

This possible embodiment facilitates heat dissipation of the wireless transmission module.

In an embodiment, the wireless transmission module further includes a solder resist layer located under the second line layer, and windows are provided at different positions on the solder resist layer according to an electrical connection requirement.

In an embodiment, the wireless transmission module further includes:

a third dielectric layer located between the upper surface of the substrate and the first line layer.

In an embodiment, the conductive material is copper.

A second aspect of this application provides an electronic device. The electronic device includes a mainboard, a rear cover of structural design, and a wireless transmission module disposed on the rear cover of the structural design, where the wireless transmission module is the wireless transmission module described in any one of the foregoing possible embodiments, and the wireless transmission module is conducted by using a flexible circuit board and is connected to the mainboard by using a connector.

The electronic device provided in the second aspect of this application has a technical effect the same as that of the wireless transmission module provided in the first aspect.

A third aspect of this application provides a manufacturing method for a wireless transmission module, including:

forming, on a carrier board, first cavities capable of accommodating chips, a second cavity used to accommodate a passive component, and first through holes;

respectively placing the chips and the passive component inside the first cavities and the second cavity, and integrating the chips, the passive component, and the carrier board through a molding process;

forming blind holes on a lower surface of the carrier board opposite to the chips;

filling the first through holes and the blind holes with a conductive material, and respectively manufacturing a first line layer and a second line layer on an upper surface and the lower surface of the carrier board, to form a substrate;

forming a magnetic shield layer structure on the substrate;

forming, on the magnetic shield layer structure, second through holes extending through an upper surface and a lower surface of the magnetic shield layer structure; and filling the second through holes with a conductive material, and forming a coil on the magnetic shield layer structure, where the coil is interconnected with the chips through the second through holes, the first line layer, the first through holes, the blind holes, and the second line layer.

In the manufacturing method for a wireless transmission module provided in the third aspect of this application, the wireless transmission module can be integrally formed, a manufacturing procedure of the wireless transmission module is simplified, and costs are reduced. Because the wireless transmission module can be formed at a time, processes in the manufacturing procedure are reduced, facilitating cost reduction.

In an embodiment, the forming a magnetic shield layer structure on the substrate includes:

press-fitting a first dielectric layer onto the first line layer;

press-fitting a magnetic shield layer onto the first dielectric layer; and press-fitting a second dielectric layer onto the magnetic shield layer.

This possible embodiment facilitates thinning of the manufactured wireless transmission module.

In an embodiment, the method further includes:

forming a solder resist layer under the second line layer, where windows are provided at different positions on the solder resist layer according to an electrical connection requirement.

In an embodiment, before the forming a first line layer on an upper surface of the carrier board, the method further includes:

forming a third dielectric layer on the upper surface of the carrier board.

Compared with the prior art, this application has the following beneficial effects:

As can be learned from the foregoing technical solutions, in the wireless transmission module provided in this application, the chips, the passive component, and the coil are integrated into an integral structure, to improve an integration level of the wireless transmission module. In addition, the integral structure can effectively implement independence of the module, the independent module may be flexibly arranged inside structural design of an electronic device, and does not need to be disposed on a mainboard of the electronic device, and only an input terminal of the wireless transmission module needs to be retained on the mainboard of the electronic device. Therefore, the wireless transmission module occupies a relatively small area of the mainboard. In addition, in the wireless transmission module in this application, the chips are embedded inside the substrate, so that disposing the chips does not increase a size of the wireless transmission module, or has very small impact on a size of the wireless transmission module. Therefore, compared with a wireless transmission module in the prior art, the wireless transmission module provided in this application helps to improve miniaturization and thinning of the electronic device. In addition, in the integral structure, sensitive components such as the chips and the passive component are embedded inside the substrate, and are not in contact with an external environment. Therefore, the wireless transmission module provided in this application can further effectively increase a capability of a product for working continuously and normally in an extremely harsh scenario, and improve product reliability. In addition, in the structure of the wireless transmission module, the chips and the coil are integrated, and signal transmission paths between the chips and the coil are relatively short. Therefore, the parasitic impedance generated on the signal transmission paths is relatively low, thereby increasing power density of the module.

BRIEF DESCRIPTION OF DRAWINGS

To clearly understand implementations of this application, the following briefly describes accompanying drawings used for describing the implementations of this application.

DESCRIPTION OF EMBODIMENTS

As can be learned from the background, an existing wireless transmission module has a problem of a low integration level, and further has the following problems:

1. It does not facilitate miniaturization and thinning of an electronic device in which a wireless transmission module is assembled.

2. Sensitive components of the wireless transmission module are easily damaged, and product reliability is relatively low.

3. Parasitic impedance is relatively high, and as a result, power density of the module is relatively low.

To resolve the foregoing technical problems, in the embodiments of this application, chips, a passive component, a magnetic material, and a coil are integrated to form an integral wireless transmission module, to improve an integration level of the wireless transmission module. The integral wireless transmission module may be flexibly arranged inside structural design of an electronic device, and does not need to be disposed on a mainboard of the electronic device, and only an input terminal of the wireless transmission module needs to be retained on the mainboard. Therefore, the wireless transmission module occupies a relatively small area of the mainboard. This helps to reduce overall thickness of the electronic device, and further helps to improve miniaturization and thinning of the electronic device. In addition, in the integral structure, sensitive components such as the chips and the passive component are embedded inside the substrate, and are not in contact with an external environment. Therefore, the wireless transmission module provided in this application can further effectively increase a capability of a product for working continuously and normally in an extremely harsh scenario, and improve product reliability. In addition, in the structure of the wireless transmission module, the chips and the coil are integrated, and signal transmission paths between the chips and the coil are relatively short. Therefore, the parasitic impedance generated on the signal transmission paths is relatively low, thereby increasing power density of the module.

The following describes, in detail with reference to the accompanying drawings, an embodiment of the wireless transmission module provided in this application.

Figure 2:
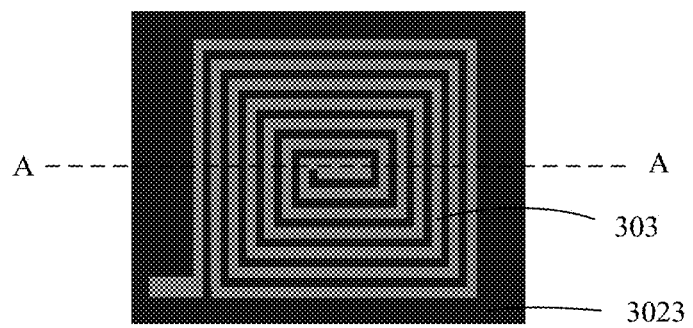
FIG. 2 is a top view of a wireless transmission module according to an embodiment of this application.
Figure 3:
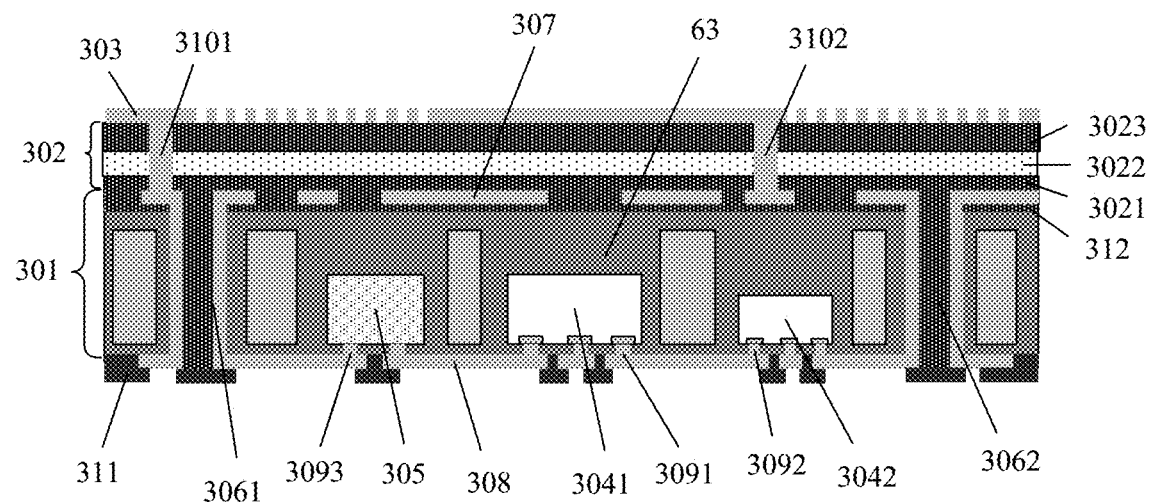
FIG. 3 is a sectional view of a wireless transmission module in an A-A direction in FIG. 2 according to an embodiment of this application.

Referring to FIG. 2 and FIG. 3, FIG. 2 is a top view of a wireless transmission module according to an embodiment of this application, and FIG. 3 is a sectional view of the wireless transmission module in an A-A direction in FIG. 2 according to an embodiment of this application.

The wireless transmission module provided in this embodiment of this application includes a substrate 301, a magnetic shield layer structure 302 located on the substrate 301, and a coil 303 located on the magnetic shield layer structure 302.

A first chip 3041, a second chip 3042, and a passive component 305 that are separated from each other are embedded inside the substrate 301. First through holes 3061 and 3062 that extend through an upper surface and a lower surface of the substrate 301 are further disposed on the substrate 301, and the first through holes 3061 and 3062 are filled with a conductive material. In an example, the conductive material may be copper. It should be noted that in FIG. 3, two first through holes are used as an example for description. Actually, in this embodiment of this application, a quantity of the first through holes is not limited to two, and a plurality of first through holes may be disposed according to a requirement.

A first line layer 307 is disposed on the upper surface of the substrate 301, and a second line layer 308 is disposed on the lower surface of the substrate 301. A first blind hole 3091 is disposed between the second line layer 308 and the first chip 3041, a second blind hole 3092 is disposed between the second line layer 308 and the first chip 3042, a third blind hole 3093 is disposed between the second line layer 308 and the passive component 305, and all of the first blind hole 3091, the second blind hole 3092, and the third blind hole 3093 are filled with a conductive material. In an example, the conductive material may be copper. It should be noted that different quantities of the first blind holes 3091, the second blind holes 3092, and the third blind holes 3093 may be disposed according to a requirement. This is not limited in this embodiment of this application. To simplify a manufacturing procedure of the module, filling of the first blind hole 3091, the second blind hole 3092, and the third blind hole 3093 may be completed at the same time when the second line layer 308 is manufactured.

It should be noted that in this embodiment of this application, the first chip 3041, the second chip 3042, and the passive component 305 may be embedded inside preset cavities inside the substrate 301 by using a plastic packaging material 63 through a molding process.

In an example, a lower surface of the magnetic shield layer structure 302 may be attached to the upper surface of the substrate 301.

Second through holes 3101 and 3102 that extend through an upper surface and the lower surface of the magnetic shield layer structure 302 are disposed on the magnetic shield layer structure 302, and the second through holes 3101 and 3102 are filled with a conductive material. It should be noted that in FIG. 3, two second through holes are used as an example for description. Actually, in this embodiment of this application, a quantity of the second through holes is not limited to two, and a plurality of second through holes may be disposed according to a requirement.

To implement thinning of the wireless transmission module, for the magnetic shield layer structure 302, embedded component package (ECP) and a thinned coil magnetic material processing process may be used, to form a magnetic shield layer embedded structure. In an example, the magnetic shield layer embedded structure may include a first dielectric layer 3021, a magnetic shield layer 3022, and a second dielectric layer 3023 that are laminated and bonded together, the magnetic shield layer 3022 is sandwiched between the first dielectric layer 3021 and the second dielectric layer 3023, and the first dielectric layer 3021 is located on the first line layer 307.

In an example, both the first dielectric layer 3021 and the second dielectric layer 3023 may be resin beds. More A material of the resin bed may be ABF or PP. When the first dielectric layer 3021 and the second dielectric layer 3023 are resin beds, a press-fitting process may be used, to press-fit the first dielectric layer 3021 onto the first line layer 307, press-fit the magnetic shield layer 3022 onto the first dielectric layer 3021, and press-fit the second dielectric layer 3023 onto the magnetic shield layer 3022, to form an embedded structure in which the magnetic shield layer is embedded between the first dielectric layer 3021 and the second dielectric layer 3023.

In a more example, the first dielectric layer 3021 and the second dielectric layer 3023 each may include a plurality of dielectric sub-layers.

The coil 303 is disposed on the magnetic shield layer structure 302, and may be set to different graphical shapes according to a requirement. In an example, the coil 303 may be formed by using an electroplated copper layer.

In an embodiment of this application, the coil 303 is connected to the first chip 3041 and the second chip 3042 through the first through holes 3061 and 3062, the first line layer 307, the second line layer 308, the second through holes 3101 and 3102, the first blind hole 3091, and the second blind hole 3092. In this way, the coil 303 and the chips are connected through the through holes and lines inside the substrate. Therefore, signal transmission paths between the coil 303 and the chips are relatively short, parasitic impedance generated on the signal transmission paths is relatively low, and higher power can be carried by using a smaller area or size, thereby improving power density of the module.

The first chip 3041 and the second chip 3042 are connected through the first blind hole 3091, the second line layer 308, and the second blind hole 3092.

In addition, to allow an electrical connection structure on the second line layer 308 and an external electrical connection structure to be welded together, the wireless transmission module may further include a solder resist layer 311 formed under the second line layer 308, and windows are provided at different positions on the solder resist layer 311 according to an electrical connection requirement.

In another example, to implement high insulation performance at a position at which the first line layer 307 and the substrate 301 need to be insulated, the wireless transmission module in this embodiment of this application may further include:

a third dielectric layer 312 located between the upper surface of the substrate and the first line layer 307.

In an example, the third dielectric layer 312 may also be a resin bed, and a material of the resin bed may be ABF or PP. When the third dielectric layer 312 is a resin bed, the third dielectric layer 312 may be press-fitted onto the first line layer 307 through a press-fitting process.

In addition, in an example, the passive component 305 may be a passive component such as a resistor or a capacitor.

In addition, each of the first line layer 307 and the second line layer 308 may be a multi-layer line layer structure, and line layers including different quantities of layers may be designed according to an actual requirement.

Figure 1A:
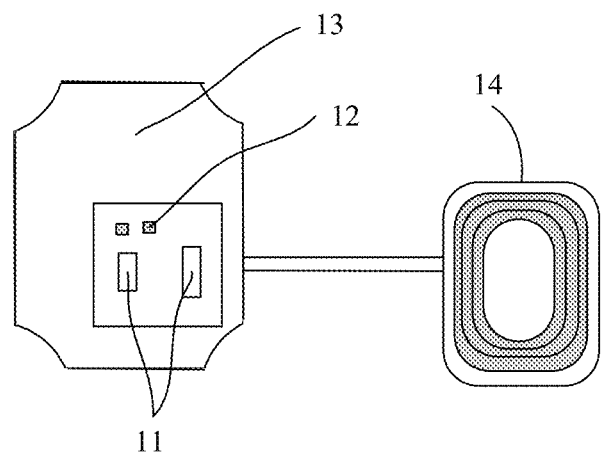
FIG. 1(a) and FIG. 1(b) are schematic diagrams of a structure of assembling a wireless transmission module and an electronic device in the art, where (a) is a top view of the assembly structure, and (b) is a schematic sectional view of the assembly structure.
Figure 1B:
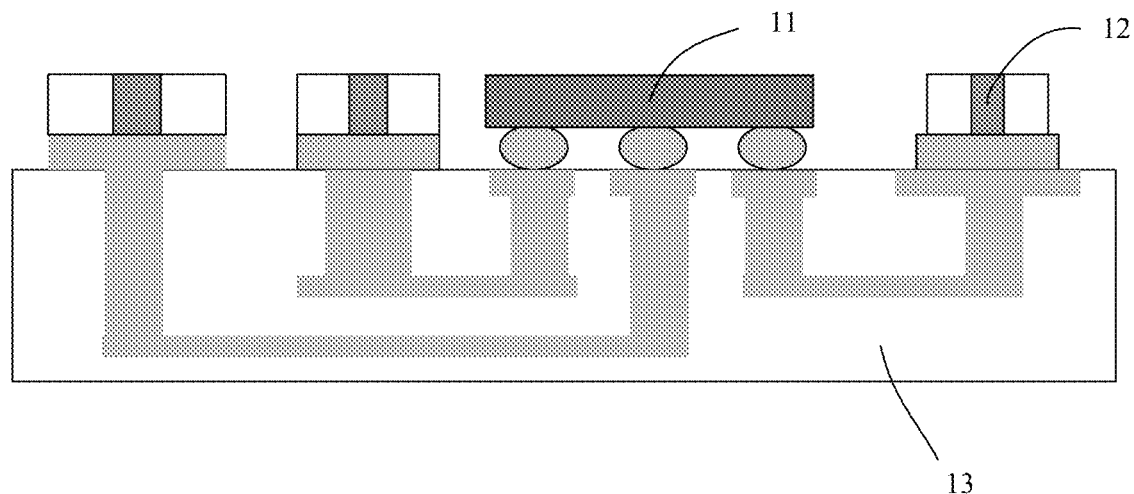

The foregoing is an embodiment of the wireless transmission module provided in this embodiment of this application. In this embodiment, the chips, the passive component, and the coil are integrated into an integral structure, to improve an integration level of the wireless transmission module. In addition, the integral structure can effectively implement independence of the module, and the independent module can be flexibly arranged inside structural design of an electronic device, and does not need to be disposed on a mainboard of the electronic device. In this way, only an input terminal of the wireless transmission module needs to be retained on the mainboard of the electronic device. Therefore, the wireless transmission module occupies a relatively small area of the mainboard, thereby reducing a requirement on an assembly area of the wireless transmission module. As verified through a test, a board occupation area of the wireless transmission module provided in this embodiment of this application is about 20% of a board occupation area of the transmission module structure shown in FIG. 1(a) and FIG. 1(b). The wireless transmission module occupying a relatively small area of the mainboard helps to reduce entire thickness of the electronic device, and further helps to improve miniaturization and thinning of the electronic device.

In addition, in the integral structure, sensitive components such as the chips and the passive component are embedded inside the substrate, and are not in contact with an external environment. Therefore, the wireless transmission module provided in this application can further effectively increase a capability of a product for working continuously and normally in an extremely harsh scenario, and improve product reliability.

In addition, in the structure of the wireless transmission module, the chips and the coil are integrated. In addition, in this application, the chips and the coil are connected through the through holes and the blind holes that are disposed inside the substrate and the line layers (similar to a re-layout layer structure) disposed on the surface of the substrate in this application. In other words, in this embodiment of this application, the coil and the chips are connected by using the re-layout layer structure. Therefore, the signal transmission paths between the chips and the coil are relatively short, parasitic impedance generated on the signal transmission paths is relatively low, and higher power can be carried by using a smaller area or size, thereby improving power density of the module.

In addition, in the wireless transmission module, embedded component package (ECP) and a thinned coil magnetic material processing process may be used, to dispose the magnetic shield layer structure on the substrate. In this way, there is no need to dispose a metal shielding enclosure outside the wireless transmission module. Therefore, the wireless transmission module can effectively reduce thickness of the wireless transmission module, and further implement thinning of the electronic device.

In addition, in the wireless transmission module, the components may be evenly distributed inside the substrate and on the surfaces of the substrate, and heat dissipation of the entire module can be implemented by using the substrate 301 and the coil 303. Therefore, the wireless transmission module provided in this application has good heat dissipation performance. In addition, to improve heat dissipation performance of the wireless transmission module, a base material of the substrate 301 may be a material having good heat conducting performance, for example, copper. Therefore, the substrate 301 may be a copper plate.

It should be noted that two chips are used as an example for description in the embodiment of the wireless transmission module. Actually, in the wireless transmission module provided in this embodiment of this application, one chip may be included, or at least three chips may be included. This is not limited herein. In addition, in this embodiment of this application, the chips embedded inside the substrate 301 may be chips used in the energy field, for example, wireless charging chips, or may be another chip having a radio signal transmission function such as a radio frequency signal transmission function, for example, NFC.

In addition, in an example, to simplify a manufacturing process of the wireless transmission module, the chips and the passive component may be embedded inside the substrate by using the plastic packaging material through the plastic packaging process. It should be noted that in this example, the cavities used to accommodate the chips and the passive component are pre-disposed inside the substrate.

In addition, in the wireless transmission module shown in FIG. 3, the coil and the chips are connected by using an internal structure of the substrate and the line layers on the substrate. Actually, in this embodiment of this application, a manner in which the coil and the chips are connected is not limited to the foregoing connection manner. As an extension to this embodiment of this application, the coil and the chips may be connected by using bonding wires.

The foregoing is an embodiment of the wireless transmission module provided in the embodiments of this application. Based on the embodiment, an embodiment of this application further provides an electronic device.

Figure 4:
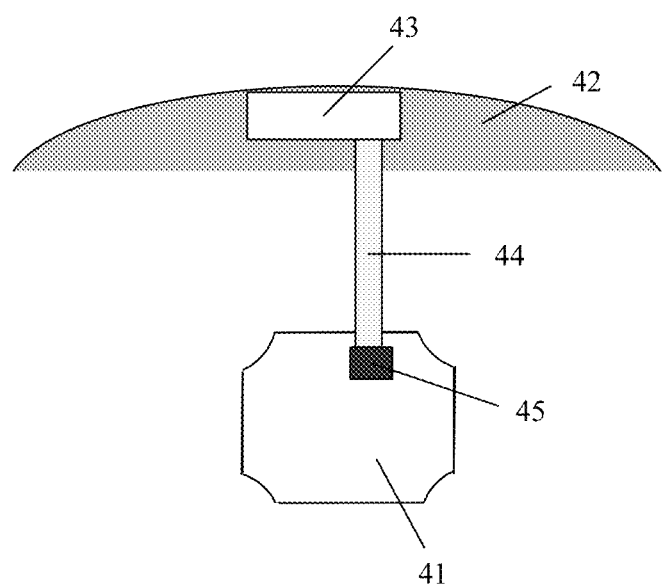
FIG. 4 is a schematic structural diagram of an electronic device according to an embodiment of this application.

Referring to FIG. 4, the electronic device provided in this embodiment of this application includes a mainboard 41, a rear cover 42 of structural design, and a wireless transmission module 43 fixed onto the rear cover 42 of the structural design. The wireless transmission module 43 is the wireless transmission module described in any one of the foregoing possible embodiments, and the wireless transmission module 43 is conducted by using a flexible circuit board 44 and is connected to the mainboard 41 by using a connector 45.

In the electronic device shown in FIG. 4, the wireless transmission module 43 does not need to be disposed on the mainboard 41, there is no need to reserve an area on the mainboard 41 for the wireless transmission module, and only an input terminal of the wireless transmission module 43 needs to be retained on the mainboard 41. Therefore, more other components may be disposed in a limited area of the mainboard 41. In addition, a magnetic shield layer structure is disposed in the wireless transmission module 43, and therefore, the wireless transmission module 43 does not generate electromagnetic signal interference to other components inside the electronic device.

Based on an embodiment of the wireless transmission module provided in the foregoing embodiment, an embodiment of this application further provides a manufacturing method for a wireless transmission module.

Figure 5:
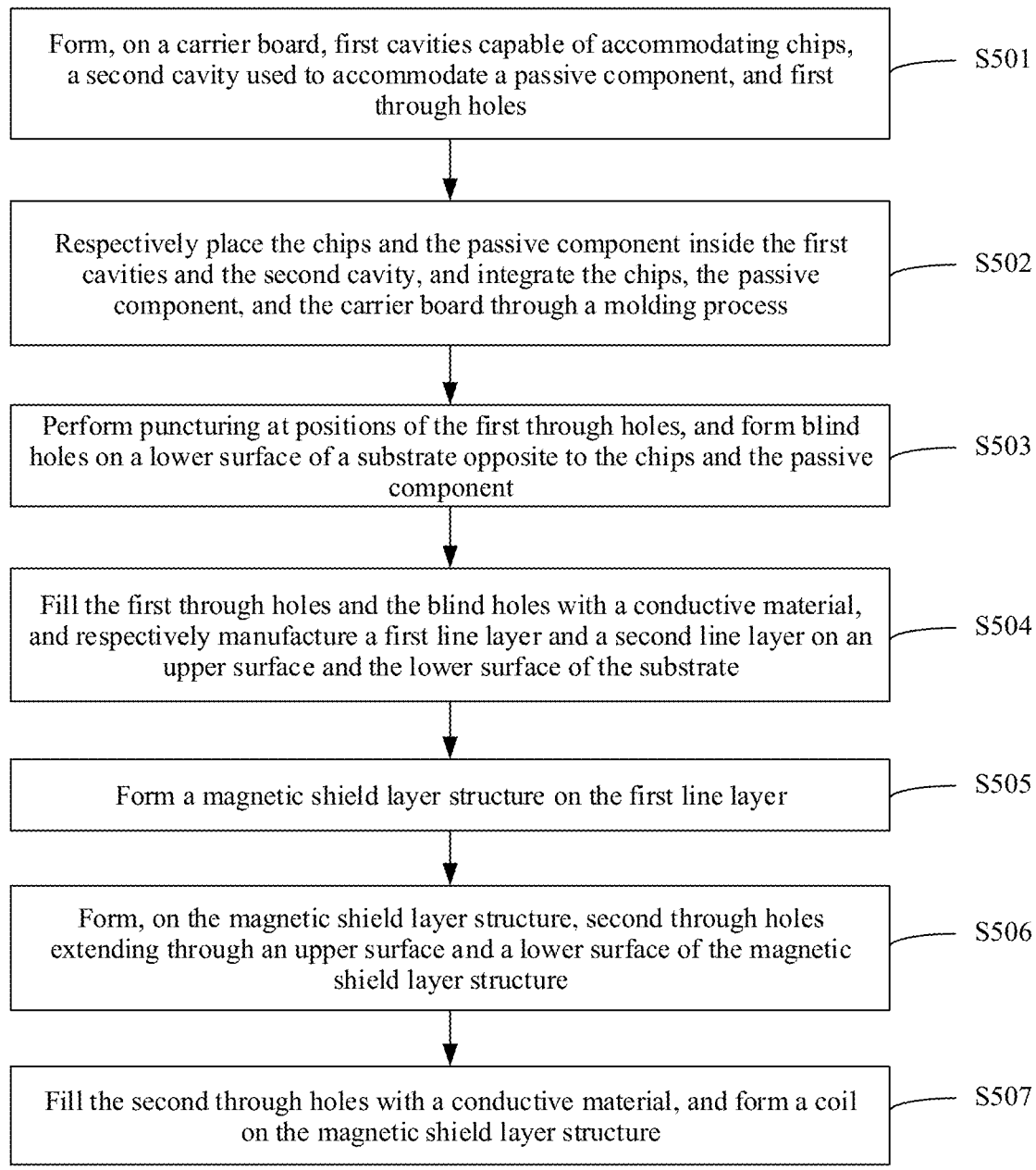
FIG. 5 is a schematic flowchart of a manufacturing method for a wireless transmission module according to an embodiment of this application.
Figure 6A:
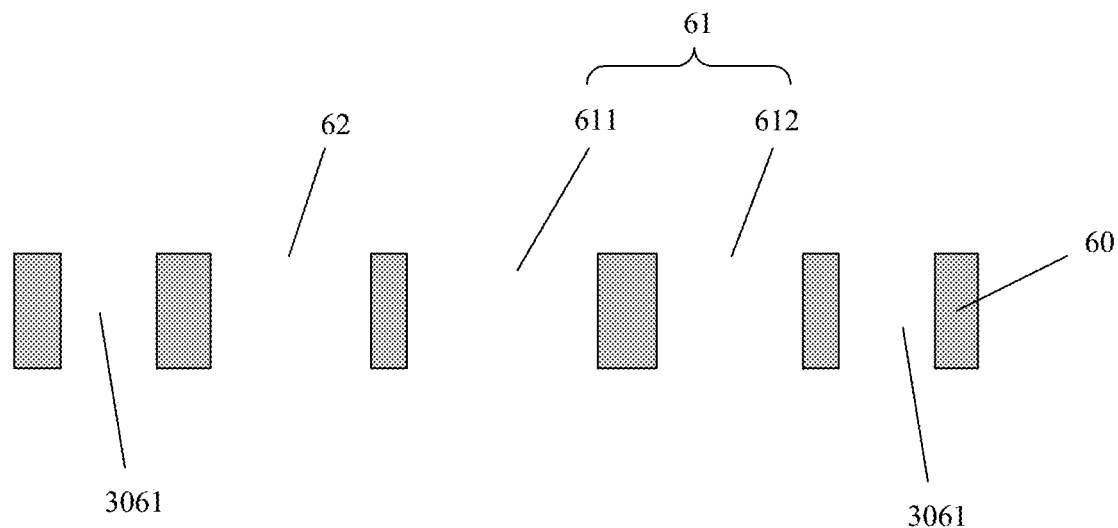
FIG. 6A to FIG. 6L are schematic diagrams of sectional structures corresponding to a series of processes in a manufacturing method for a wireless transmission module according to an embodiment of this application.
Figure 6B:
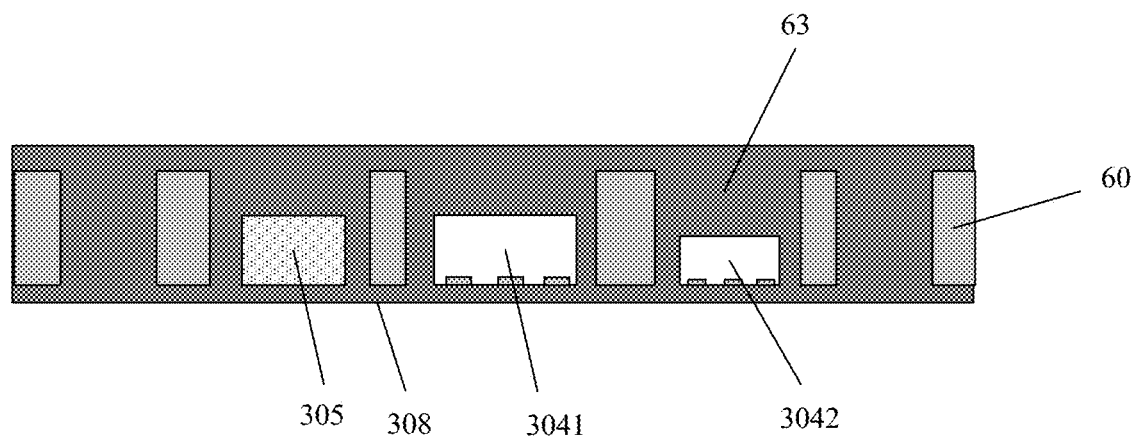
Figure 6C:
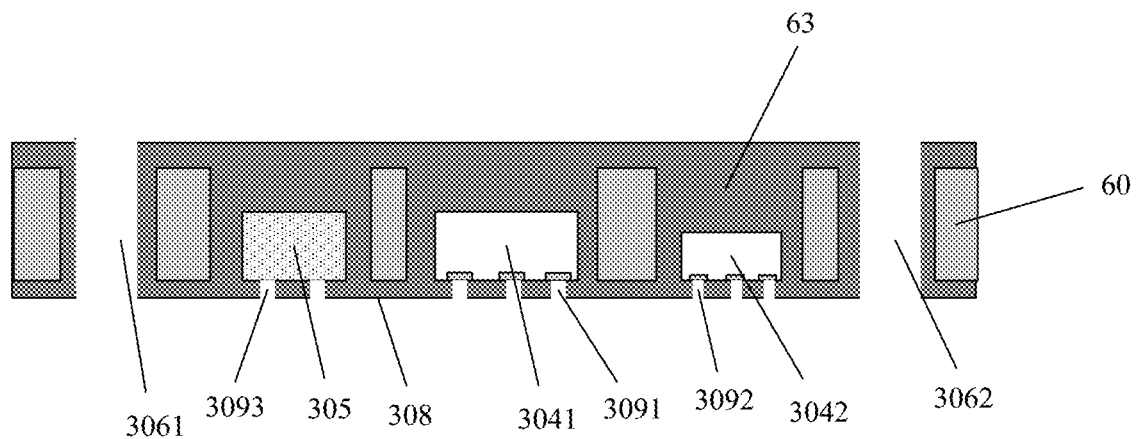
Figure 6D:
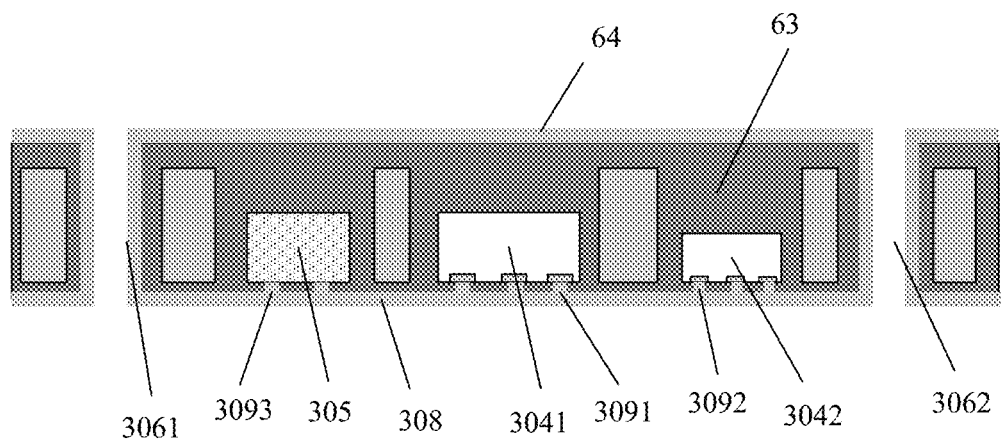
Figure 6E:
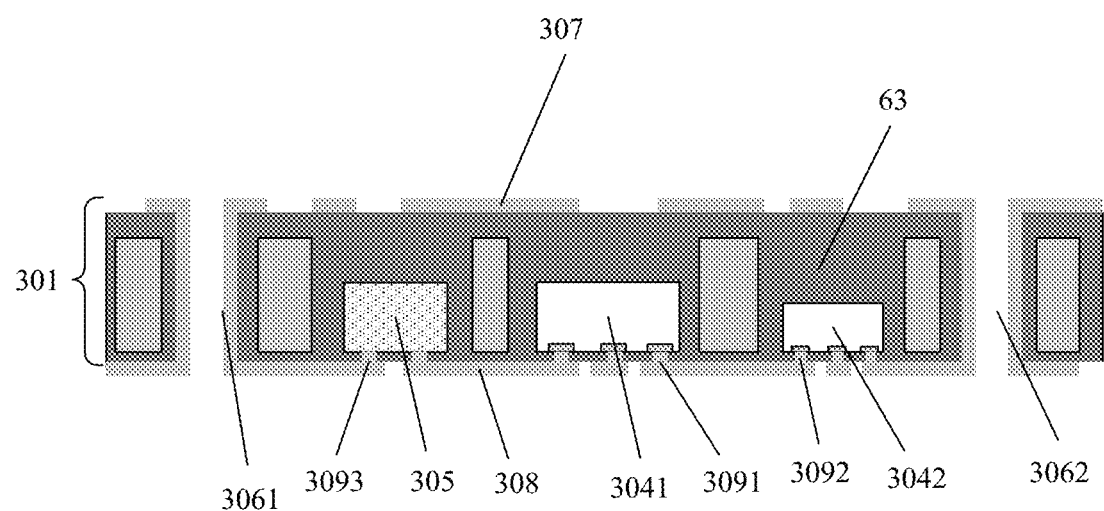
Figure 6F:
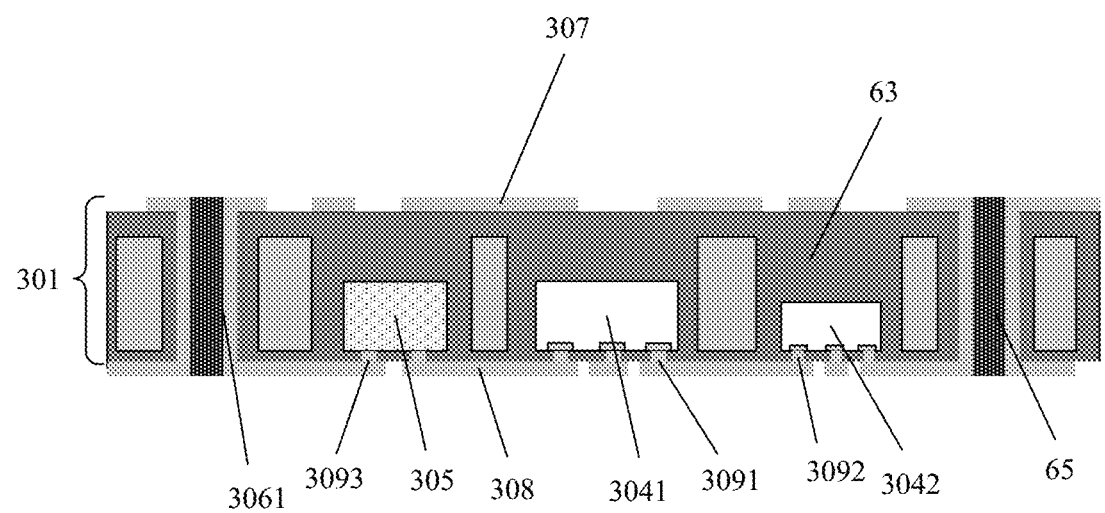
Figure 6G:
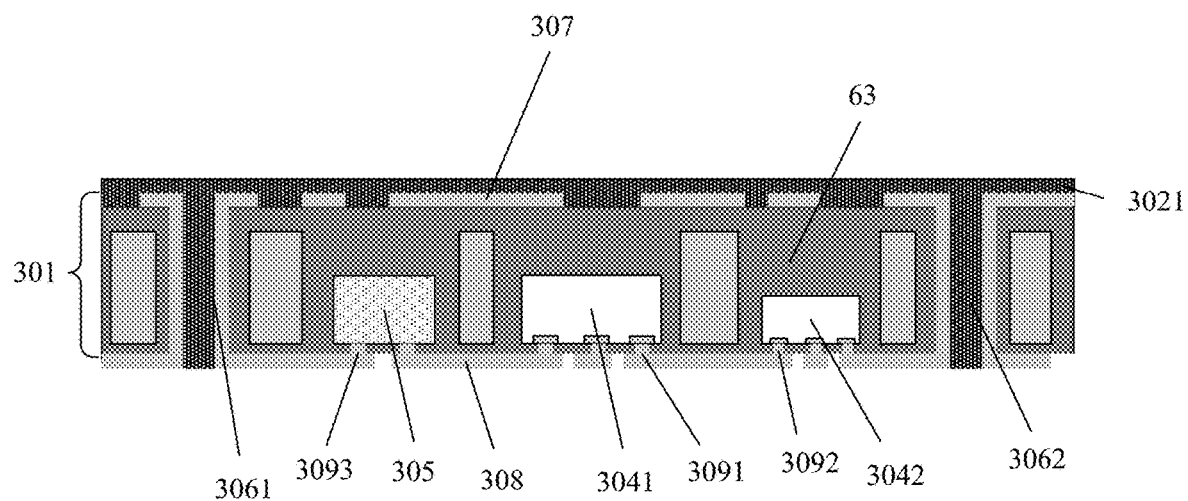
Figure 6H:
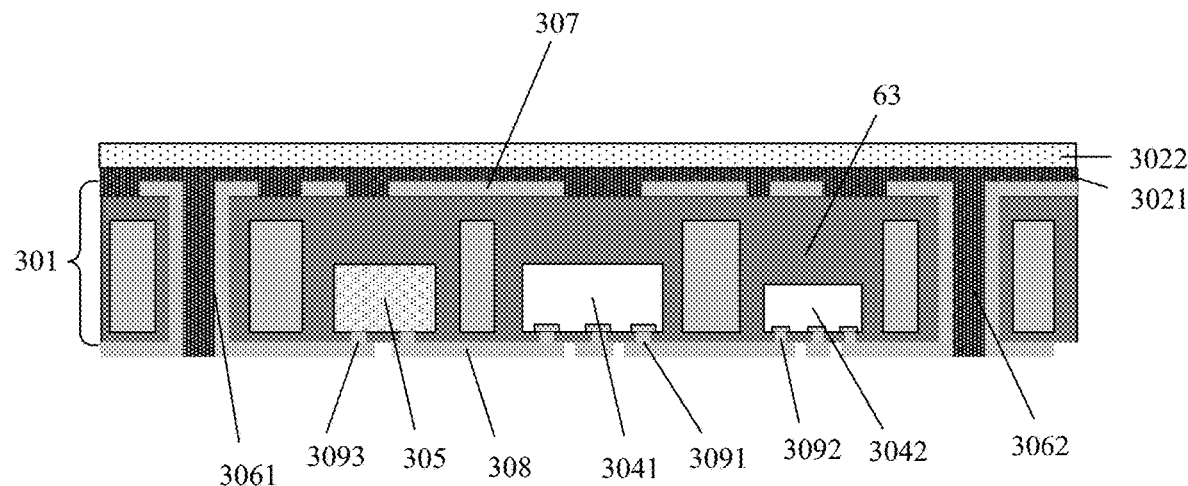
Figure 6I:
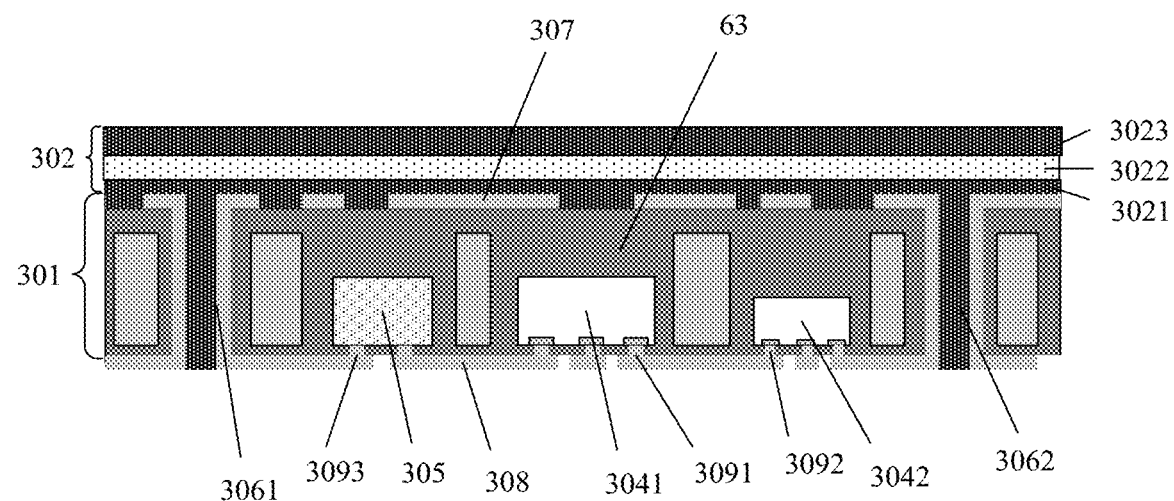
Figure 6J:
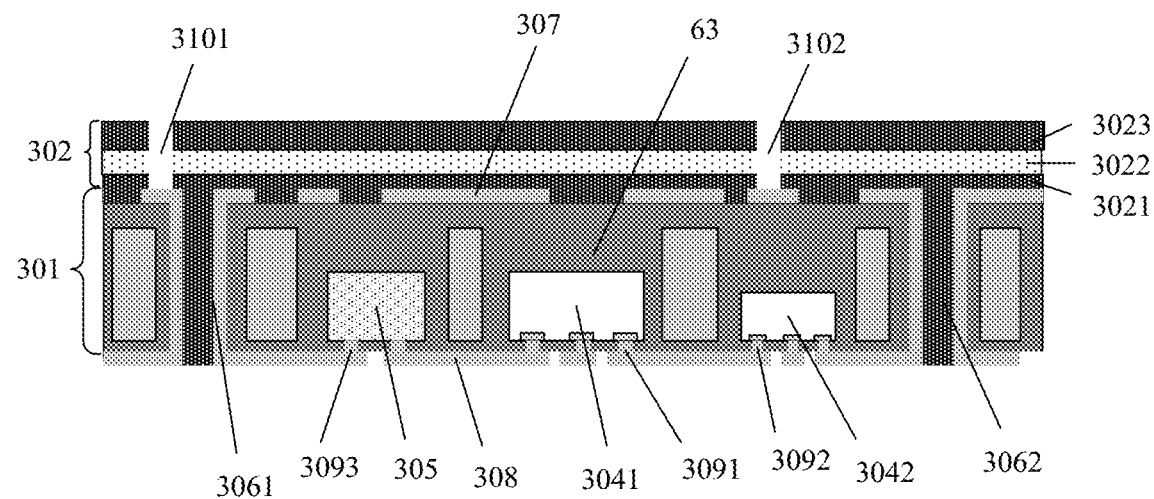
Figure 6K:
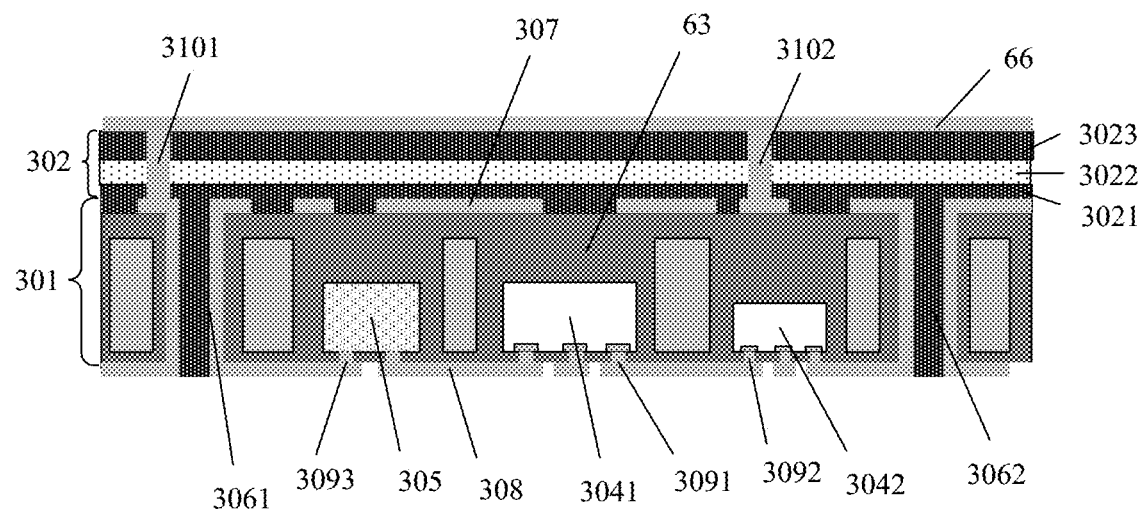
Figure 6L:
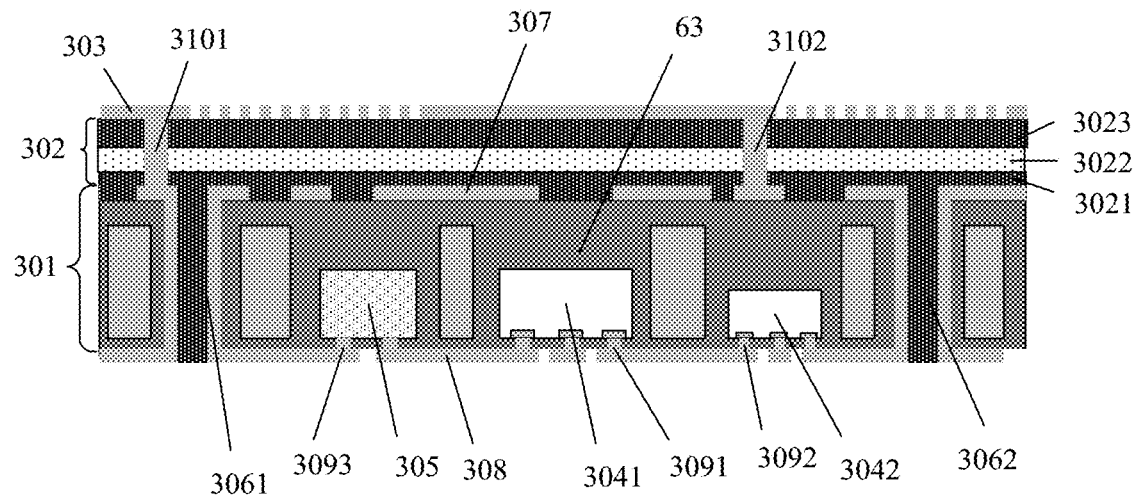

The foregoing describes, with reference to FIG. 5 to FIG. 6L, an embodiment of the manufacturing method for a wireless transmission module provided in an embodiment of this application.

Referring to FIG. 5, the manufacturing method for a wireless transmission module provided in this embodiment of this application includes the following operations:

S501: Form, on a carrier board, first cavities capable of accommodating chips, a second cavity used to accommodate a passive component, and first through holes.

It should be noted that the first cavity 61, the second cavity 62, and the first through holes 3061 and 3062 that are formed on the carrier board 60 are separated from each other. In addition, the first cavity 61, the second cavity 62, and the first through holes 3061 and 3062 extend through an upper surface and a lower surface of the carrier board 60.

In addition, in this embodiment of this application, one first cavity 61 is used to accommodate one chip, and one second cavity 62 is used to accommodate one passive component. Therefore, when a to-be-manufactured wireless transmission module includes a plurality of chips and one passive component, a plurality of first cavities 61 and one second cavity 62 need to be formed on the carrier board 60.

In an example, this embodiment of this application is described by using an example in which the to-be-manufactured wireless transmission module includes two chips (a first chip and a second chip) and one passive component. In this way, in this example, as shown in FIG. 6A, first cavities 611 and 612 respectively capable of accommodating the first chip and the second chip, the second cavity 62 capable of accommodating the passive component, and the first through holes 3061 and 3062 used for subsequent electrical connection are formed on the carrier board 60.

In an embodiment of this application, to improve heat dissipation performance of the to-be-manufactured wireless transmission module, a base material of the carrier board 60 may be made of a copper material. In other words, the carrier board 60 may be a copper plate.

S502: Respectively place the chips and the passive component inside the first cavities and the second cavity, and integrate the chips, the passive component, and the carrier board through a molding process.

Because the first cavity 61 and the second cavity 62 extend through the upper surface and the lower surface of the carrier board 60, to enable the carrier board 60 to carry the chip and the passive component, before the chip and the passive component are placed in the first cavity and the second cavity, one layer of a carrier film capable of sealing the first cavity 61 and the second cavity 62 needs to be attached to the lower surface of the carrier board 60.

An embodiment of this operation is described still by using the foregoing example. As shown in FIG. 6B, first, after the carrier film (not shown in the figure) capable of sealing the first cavity 61 and the second cavity 62 is attached to the lower surface of the carrier board 60, the first chip 3041 is placed inside the first cavity 611, and the second chip 3042 is placed inside the second cavity 612. Then, the first chip 3041, the second chip 3042, and the passive component 305 are integrated with the carrier board 60 by using a plastic packaging material 63 through a molding process. Finally, the carrier film is removed after the first chip 3041, the second chip 3042, and the passive component 305 are integrated with the carrier board 60.

S503: Perform puncturing at positions of the first through holes, and form blind holes on the lower surface of the carrier board opposite to the chip and the passive component.

It should be noted that when the first chip 3041, the second chip 3042, the passive component 305, and the carrier board 60 are packaged by using the plastic packaging material, the plastic packaging material also flows into the first through holes 3061 and 3062, so that the first through holes 3061 and 3062 are filled with the plastic packaging material. In addition, in the molding procedure, the plastic packaging material may cover the upper surface and the lower surface of the carrier board 60. In this way, a plastic packaging layer is formed on each of the upper surface and the lower surface of the carrier board 60.

To implement an electrical connection function of the first through holes 3061 and 3062, the plastic packaging material filled in the first through holes 3061 and 3062 need to be removed or partially removed, to form through hole structures. In addition, to implement connection of the first chip 3041, the second chip 3042, and the passive component 305 to the outside, a first blind hole 3091 needs to be formed on the lower surface of the substrate opposite to the first chip 3041, a second blind hole 3092 needs to be formed on the lower surface of the substrate opposite to the second chip 3042, and a third blind hole 3093 needs to be formed on the lower surface of the substrate opposite to the passive component 305. The first blind hole 3091 extends from an outer surface of the formed plastic packaging layer inwards to a lower surface of the first chip 3041, the second blind hole 3092 extends from the outer surface of the formed plastic packaging layer inwards to a lower surface of the second chip 3042, and the third blind hole 3093 extends from the outer surface of the formed plastic packaging layer inwards to a lower surface of the passive component 305.

In an example, the carrier board 60 may be etched by using a laser etching method, to form the first through holes 3061 and 3062 at the positions of the first through holes, form the first blind hole 3091 on the lower surface of the substrate opposite to the first chip 3041, form the second blind hole 3092 on the lower surface of the substrate opposite to the second chip 3042, and form the third blind hole 3093 on the lower surface of the substrate opposite to the passive component 305. A schematic diagram of a sectional structure obtained after this operation is completed is shown in FIG. 6C.

S504: Fill the first through holes and the blind holes with a conductive material, and respectively manufacture a first line layer and a second line layer on an upper surface and the lower surface of the carrier board.

In an example, each of the upper surface and the lower surface of the carrier board 60 may be electroplated with a copper layer 64 through an electroplating process. In an electroplating procedure, the first through holes 3061 and 3062, the first blind hole 3091, the second blind hole 3092, and the third blind hole 3093 are filled with electro-copper, to fill the first through holes 3061 and 3062, the first blind hole 3091, the second blind hole 3092, and the third blind hole 3093 with the conductive material. A schematic diagram of a sectional structure obtained after the electroplating process is completed is shown in FIG. 6D.

After the upper surface and the lower surface of the carrier board 60 are electroplated with the copper layers 64, as shown in FIG. 6E, a substrate line forming process may be used to remove the corresponding copper layers through etching, to form the first line layer 307 on the upper surface of the substrate, and form the second line layer 308 on the lower surface of the substrate.

It should be noted that S504 is implemented through, but not limited to, an electrocoppering process, and may be alternatively implemented through another process such as a thin film deposition process.

In addition, it should be noted that because the line layers are relatively thin, and generally, apertures of the first through holes 3061 and 3062 are greater than thickness of the line layers, after the first line layer 307 and the second line layer 308 are formed, the first through holes 3061 and 3062 are not full of the conductive material. In this way, regions of the first through holes 3061 and 3062 close to the center are empty. In this case, the first through holes 3061 and 3062 may be further filled with a dielectric material 65 such as a resin material. A schematic diagram of a sectional structure obtained after the process is completed is shown in FIG. 6F.

It should be noted that S501 to S504 are a manufacturing procedure of the substrate. In this way, the substrate is manufactured by using S501 to S504.

S505: Form a magnetic shield layer structure on the first line layer.

It should be noted that in this embodiment of this application, to implement thinning of the wireless transmission module, for the magnetic shield layer structure, embedded component package (ECP) and a thinned coil magnetic material processing process may be used, to form a magnetic shield layer embedded structure.

In this way, S505 may include the following operations:

A. Press-Fit a First Dielectric Layer 3021 onto the First Line Layer 307.

In an example, a material of the first dielectric layer 3021 may be ABF or PP resin. In this example, as shown in FIG. 6G, the ABF or PP resin is press-fitted onto the first line layer 307, to form the first dielectric layer 3021.

B. Press-Fit a Magnetic Shield Layer 3022 onto the First Dielectric Layer 3021.

As shown in FIG. 6H, the magnetic shield layer 3022 is press-fitted onto the first dielectric layer 3021.

C: Press-Fit a Second Dielectric Layer 3023 onto the Magnetic Shield Layer 3022.

In an example, a material of the second dielectric layer 3023 may be ABF or PP resin. In this example, as shown in FIG. 6I, the ABF or PP resin is press-fitted onto the first line layer 307, to form the second dielectric layer 3023.

The magnetic shield layer 3022 may be embedded between the dielectric layers by using operation A to operation C, to form the magnetic shield layer structure 302.

S506: Form, on the magnetic shield layer structure, second through holes that extend through an upper surface and a lower surface of the magnetic shield layer structure.

The magnetic shield layer structure 302 is punctured through a laser etching process, to form, on the magnetic shield layer structure 302, the second through holes 3101 and 3102 that extend through the upper surface and the lower surface of the magnetic shield layer structure 302, and the second through holes 3101 and 3102 separately communicate with the first line layer 307. A schematic diagram of a sectional structure obtained after the process is completed is shown in FIG. 6J. It should be noted that for an entire structure, because the second through holes 3101 and 3102 extend through only the magnetic shield layer structure 302, and do not extend through an upper surface and a lower surface of the entire structure, the second through holes may be considered as deep blind holes.

S507: Fill the second through holes with a conductive material, and form a coil on the magnetic shield layer structure.

This operation may be: forming a copper layer 66 on the magnetic shield layer structure 302 through an electrocoppering process. In an electrocoppering procedure, the second through holes 3101 and 3102 formed in operation S506 are filled with copper, to obtain a schematic diagram of a sectional structure shown in FIG. 6K.

In the wireless transmission module, the coil may be designed into different shapes according to a requirement. Therefore, to form a needed coil, a substrate line forming process may be used, to remove a corresponding copper layer through etching, to form the coil 303 having a needed graphical shape. A schematic diagram of a sectional structure obtained after the process is completed is shown in FIG. 6L.

The wireless transmission module provided in this embodiment of this application may be manufactured by using operation S507 and operation S508. In the wireless transmission module, the coil 303 is connected to the chips through the second through holes 3101 and 3102, the first line layer 307, the first through holes 3061 and 3062, the blind holes 3091 and 3092, and the second line layer 308. Different chips are connected through the blind holes 3091 and 3092 and the second line layer 308.

In an example of this application, to allow an electrical connection structure on the second line layer 308 and an external electrical connection structure to be welded together, the manufacturing method for a wireless transmission module in the foregoing embodiment may further include:

forming a solder resist layer 211 under the second line layer, where windows are provided at different positions on the solder resist layer 211 according to an electrical connection requirement.

In another example, to implement high insulation performance at a position at which the first line layer 307 and the substrate 301 need to be insulated, before the forming a first line layer 307 on an upper surface of the substrate, the manufacturing method for a wireless transmission module in the foregoing embodiment may further include:

forming a third dielectric layer 312 on the upper surface of the carrier board.

The structure of the wireless transmission module shown in FIG. 2 and FIG. 3 is finally formed by using the foregoing operations.

The foregoing is an embodiment of the manufacturing method for a wireless transmission module provided in the embodiments of this application. In an embodiment, the wireless transmission module can be integrally formed, a manufacturing procedure of the wireless transmission module is simplified, and costs are reduced. Because the wireless transmission module can be formed at a time, processes in the manufacturing procedure are reduced, facilitating cost reduction.

The foregoing are embodiments of the wireless transmission module and the manufacturing method therefor that are provided in the embodiments of this application.

What is claimed is:

1. A wireless transmission module, comprising:
   a substrate,
   a magnetic shield layer structure located on the substrate,
   a coil located on the magnetic shield layer structure, wherein a plurality of chips and a passive component separated from each other are embedded inside the substrate, and wherein the coil is electrically connected to the chips,
   a first line layer disposed on an upper surface of the substrate,
   a second line layer disposed on a lower surface of the substrate,
   a plurality of first through holes extending through the upper surface and the lower surface of the substrate, wherein the first through holes are filled with a conductive material,
   a plurality of second through holes extending through an upper surface and a lower surface of the magnetic shield layer structure, wherein the second through holes are filled with the conductive material, and
   a plurality of blind holes disposed between the second line layer and the chips, and the blind holes are filled with the conductive material,
   wherein the coil is interconnected with the chips through the second through holes, the first line layer, the first through holes, the blind holes, and the second line layer.

2. The wireless transmission module according to claim 1, wherein different chips are interconnected with the second line layer through the blind holes.

3. The wireless transmission module according to claim 1, wherein the magnetic shield layer structure comprises a first dielectric layer, a magnetic shield layer, and a second dielectric layer that are laminated and bonded together, wherein the magnetic shield layer is sandwiched between the first dielectric layer and the second dielectric layer.

4. The wireless transmission module according to claim 3, wherein the first dielectric layer and/or the second dielectric layer comprises a plurality of layers of sub-dielectric layers.

5. The wireless transmission module according to claim 1, wherein a base material of the substrate is copper.

6. The wireless transmission module according to claim 1, wherein the wireless transmission module further comprises: a solder resist layer located under the second line layer, wherein windows are provided at different positions on the solder resist layer according to an electrical connection requirement.

7. The wireless transmission module according to claim 1, wherein the wireless transmission module further comprises:
   a third dielectric layer located between the upper surface of the substrate and the first line layer.

8. The wireless transmission module according to claim 1, wherein the conductive material is copper.

9. A manufacturing method for a wireless transmission module, comprising:
   forming, on a carrier board, first cavities to accommodate a plurality of chips, a second cavity used to accommodate a passive component, and a plurality of first through holes;
   placing the chips and the passive component inside the first cavities and the second cavity;
   integrating the chips, the passive component, and the carrier board through a molding process;
   forming a plurality of blind holes on a lower surface of the carrier board opposite to the chips;
   filling the first through holes and the blind holes with a conductive material;
   manufacturing a first line layer and a second line layer on an upper surface and the lower surface of the carrier board, to form a substrate;
   forming a magnetic shield layer structure on the substrate;
   forming, on the magnetic shield layer structure, a plurality of second through holes extending through an upper surface and a lower surface of the magnetic shield layer structure; and
   filling the second through holes with the conductive material; and
   forming a coil on the magnetic shield layer structure, wherein the coil is interconnected with the chips through the second through holes, the first line layer, the first through holes, the blind holes, and the second line layer.

10. The method according to claim 9, wherein the forming the magnetic shield layer structure on the substrate comprises:
    press-fitting a first dielectric layer onto the first line layer;
    press-fitting a magnetic shield layer onto the first dielectric layer; and
    press-fitting a second dielectric layer onto the magnetic shield layer.

11. The method according to claim 9, wherein the method further comprises:
    forming a solder resist layer under the second line layer, wherein windows are provided at different positions on the solder resist layer according to an electrical connection requirement.

12. The method according to claim 9, wherein before the forming the first line layer on the carrier board, the method further comprises:

forming a third dielectric layer on the upper surface of the carrier board.

13. An electronic device, comprising:
a mainboard;
a rear cover; and
a wireless transmission module disposed on the rear cover, wherein the wireless transmission module is conducted by using a flexible circuit board and is connected to the mainboard by using a connector, wherein the wireless transmission module comprises a substrate, a magnetic shield layer structure located on the substrate, and a coil located on the magnetic shield layer structure, wherein a plurality of chips and a passive component separated from each other are embedded inside the substrate;
wherein the coil is electrically connected to the chips;
a first line layer disposed on an upper surface of the substrate;
a second line layer disposed on a lower surface of the substrate;
a plurality of first through holes extending through the upper surface and the lower surface of the substrate, wherein the first through holes are filled with a conductive material;
a plurality of second through holes extending through an upper surface and a lower surface of the magnetic shield layer structure, wherein the second through holes are filled with the conductive material; and
a plurality of blind holes disposed between the second line layer and the chips, wherein the blind holes are filled with the conductive material,
wherein the coil is interconnected with the chips through the second through holes, the first line layer, the first through holes, the blind holes, and the second line layer.

14. The electronic device according to claim 13, wherein different chips are interconnected with the second line layer through the blind holes.

15. The electronic device according to claim 13, wherein the magnetic shield layer structure comprises a first dielectric layer, a magnetic shield layer, and a second dielectric layer that are laminated and bonded together, wherein the magnetic shield layer is sandwiched between the first dielectric layer and the second dielectric layer.

16. The electronic device according to claim 15, wherein the first dielectric layer and/or the second dielectric layer comprises a plurality of layers of sub-dielectric layers.

17. The electronic device according to claim 13, wherein a base material of the substrate is copper.

18. The electronic device according to claim 13, wherein the wireless transmission module further comprises: a solder resist layer located under the second line layer, wherein windows are provided at different positions on the solder resist layer according to an electrical connection requirement.

* * * * *